United States Patent [19]

Prokes et al.

[11] Patent Number: 4,975,387
[45] Date of Patent: Dec. 4, 1990

[54] FORMATION OF EPITAXIAL SI-GE HETEROSTRUCTURES BY SOLID PHASE EPITAXY

[75] Inventors: Sharka M. Prokes, Columbia; Wen F. Tseng, Sandy Spring, both of Md.; Aristos Christou, Springfield, Va.

[73] Assignee: The United States of America as represented by the Secretary of the Navy, Washington, D.C.

[21] Appl. No.: 450,963

[22] Filed: Dec. 15, 1989

[51] Int. Cl.$^5$ .............................................. H01L 21/20
[52] U.S. Cl. ........................... 437/131; 148/DIG. 3; 148/DIG. 48; 148/DIG. 59; 148/DIG. 72; 148/DIG. 154; 148/33.4; 156/603; 437/82; 437/126; 437/247; 437/973; 437/976
[58] Field of Search .................. 148/DIG. 31, 25, 48, 148/58, 59, 72, 90, 97, 118, 154, 169, 33.1, 33.4; 156/610–614, 603; 437/81, 82, 101, 106, 126, 108, 131, 132, 133, 174, 173, 247, 939, 946, 949, 963, 973, 976

[56] References Cited

U.S. PATENT DOCUMENTS

| | | | |
|---|---|---|---|
| 4,357,183 | 11/1982 | Fan et al. | 437/126 |
| 4,409,260 | 10/1983 | Pastor et al. | 437/239 |
| 4,442,449 | 4/1984 | Lehrer et al. | 357/67 |
| 4,529,455 | 7/1985 | Bean et al. | 156/610 |
| 4,843,028 | 6/1989 | Herzog et al. | 437/131 |
| 4,857,270 | 8/1989 | Maruya et al. | 437/131 |

OTHER PUBLICATIONS

Ebner et al., "Pulsed-Laser-Assisted Molecular Beam Epitaxy", IBM TDB, vol. 26, No. 11, Apr. 1984, pp. 6215–6216.
Hung et al., "Epitaxial Growth of Si Deposited on (100) Si", Appl. Phys. Lett. 37(10), Nov. 15, 1980, pp. 909–911.
Grimaldi et al., "Epitaxial Growth of Amorphons Ge Films . . . ", J. Appl. Phys. 52(3), Mar. 1981, pp. 1351–1355.

*Primary Examiner*—Olik Chaudhuri
*Assistant Examiner*—William Bunch
*Attorney, Agent, or Firm*—Thomas E. McDonnell; Thomas V. Flannagan

[57] ABSTRACT

Epitaxial Si-Ge heterostructures are formed by depositing a layer of amorphous Si-Ge on a silicon wafer. The amorphous Si-Ge on the silicon wafer is then subjected to a wet oxidation in order to form an epitaxial Si-Ge heterostructure. Any size wafer may be used and no special precautions need be taken to ensure a clean amorphous Si-Ge/Si interface.

16 Claims, No Drawings

FORMATION OF EPITAXIAL SI-GE HETEROSTRUCTURES BY SOLID PHASE EPITAXY

BACKGROUND OF THE INVENTION

1. FIELD OF THE INVENTION

This invention relates to an improved method of forming epitaxial Si-Ge heterostructures.

2. DESCRIPTION OF THE BACKGROUND ART

Epitaxial Ge-Si heterostructures are currently of interest due to their potentially useful optical- and electronic properties. At this point, high quality strained Si-Ge/Si layers have been produced by molecular beam epitaxy (MBE) (J. C. Bean, L. C. Feldman, A. T. Fiory, S. Nakahara, and I. K. Robinson. *J. Vac. Sci. Technol.* A 2, 436 (1984)) and chemical vapor deposition (CVD) (C. M. Gronet, C. A. King, W. Opyd, J. F. Gibbons, S. D. Wilson, and R. Hull *J. Appl. Phys.* 61, 2407 (1987)). A technique such as MBE allows precise control on the scale of a fraction of a monolayer, thus allowing possible band structure engineering and tailoring of the transport and optical properties of this system (J. Bevk, J. P. Mannaerts, L. C. Feldman, B. A. Davidsov, and A. Ourmazd. *Appl. Phys. Lett.* 49, 286 (1986)).

There are several inherent problems with these techniques, however. First of all, they require extremely low interfacial contamination and precise temperature control. If there is any contamination at the Si-Ge/Si interface and. if the temperature is not precise, Si-Ge heterostructures will not form. Consequently, the set-ups for these processes are quite expensive. In addition, wafer size limitations exist because only certain size wafers will fit into the MBE machine.

Investigations of the formation of epitaxial Ge-Ge and Si-Si heterostructures by solid phase epitaxial (SPE) regrowth of evaporated amorphous films (M. G. Grimaldi, M. Maenpaa, B. M. Paine, M-A. Nicolet, S. S. Lau, and W. F. Tseng. *J. Appl. Physics.* 52, 1351 (1981)) have also been made. Again, there is the problem of contamination. Interfacial contamination is a very important consideration since results indicate that a very clean interface between the Si substrate and the amorphous layer must exist before any SPE can occur. Recently, SPE of amorphous Ge layers has been achieved by Abelson et al., produced by pulsed laser mixing (J. R. Abelson, T. W. Sigmon, Ki Bum Kim, and K. H. Weiner, *Appl. Phys. Lett.* 52, 230 (1988)). In this case, the Si and amorphous Ge interface is melted during the laser annealing, allowing SPE to occur. However, SPE, in the above methods, does require vacuum deposition.

Finally, Fathy et al. have reported on the formation of an epitaxial SiGe layer following the wet oxidation of a germanium-implanted silicon substrate (D. Fathy, 0. W. Holland, and C. W. White, *Appl. Phys. Lett.* 51, 1337 (1987)). Unfortunately, implantation processes are very expensive and require extensive and expensive equipment.

SUMMARY OF THE INVENTION

Accordingly, it is an object of this invention to form epitaxial SiGe layers by a method that is not dependent on special wafer cleaning, vacuum deposition, or implantation.

It is also an object of this invention to form epitaxial SiGe layers by a method that is not dependent on wafer size.

It is also an object of this invention to form epitaxial SiGe layers without special or extensive equipment.

It is also an object of this invention to form epitaxial SiGe layers by a repeatable and reliable epitaxial formation system.

These and additional objects of the invention are accomplished by depositing a layer of amorphous SiGe on a silicon wafer and wet oxidizing the silicon wafer/amorphous SiGe in order to form an epitaxial SiGe heterostructure.

DETAILED DESCRIPTION OF THE INVENTION

The starting material of the method invention to make epitaxial SiGe heterostructures is a silicon wafer. Preferably, Si(100) at about 0° to about 6° to <010> wafers are used, with Si (100) wafers being most preferred. Any size wafer may be used.

The silicon wafers may be doped so that resistivity measurements on the final product are possible, although this is not crucial to the invention. If the silicon wafer is doped, any range of doping and any dopant is acceptable. It is preferable to select the dopant from the group comprising boron, phosphorous, and arsenic. Most preferably, boron is selected as the dopant.

The preferred doping range is from about 0.1-$\Omega$ cm to about 300 $\Omega$-cm resistivity. In the most preferred embodiment, the silicon wafers are doped to about 30 $\Omega$-cm.

The silicon wafer may then be cleaned so that contaminants such as oil and oxides are removed. It is preferable to use a standard RCA cleaning method, such as a combination of hot trichloroethylene, acetone, methanol, and hydrofluoric acid. After the silicon wafers are cleaned, they are introduced into any kind of deposition system that will form an amorphous SiGe layer on the silicon wafer. Preferably, the deposition system is a vacuum evaporator or a sputtering machine. Most preferably, a standard electron beam evaporator is used. The ratio of germanium to silicon in the SiGe layer is not crucial to the invention, but generally can be represented by the formula $Si_xGe_{1-x}$ where x is less than 1 but greater than 0. Most preferably, x is between about 0.10 and about 0.90.

The thickness of the deposited layer will depend on the desired application for the epitaxial SiGe heterostructure. For example, a fully strained structure such as a bipolar transistor will require a thinner deposited layer than for a relaxed structure. Generally, the thickness should be from between about 800 and 1200 Å with a thickness of about 1000 Å being most preferred.

It is important to note that after the RCA cleaning of the silicon wafer, a native oxide layer will immediately form on the silicon wafer. Also, there may be hydrocarbons on the silicon wafer surface from the RCA cleaning itself. However, unlike other methods, the invention does not require any special precautions or further cleanings to remove this oxide layer or to ensure a clean interface.

Once the amorphous SiGe layer has been deposited, the amorphous SiGe/silicon wafer may again be cleaned. Although a second cleaning is not absolutely necessary, it is preferred so that the final oxide will be of uniform thickness. A standard RCA cleaning method can be used. Most preferably, the amorphous SiGe/silicon wafer is dipped in hot trichloroethylene, acetone, methanol, and hydrofluoric acid.

The resulting sample wafer is then wet oxidized at a temperature and time sufficient for epitaxial growth to occur. Any system capable of wet oxidizing the sample may be used, but it is desirable to use a tube furnace initially flushed with an inert gas, followed by passing steam over the sample during the wet oxidation.

The temperature at which the wet oxidation takes place must be high enough so that the wet oxidation produces epitaxial SiGe films but low enough so that the Ge does not evaporate. Since Ge begins to evaporate at about 950° C., the preferred range of temperature for the wet oxidation is from between about 800° C. to about 1000° C. A temperature of about 900° C. is most preferable.

The time required to produce the epitaxial SiGe film depends on the amount of Ge present in the sample. The greater the Ge content, the less time required to form an epitaxial SiGe heterostructure.

After the sample is wet oxidized, it will consist of a silicon dioxide layer resting on an epitaxial SiGe layer which in turn rests on a silicon wafer. The silicon dioxide layer can be removed, if desired, leaving a silicon wafer having a deposited layer of epitaxial SiGe.

Having described the invention, the following examples are given to illustrate specific applications of the invention. These specific examples are not intended to limit the scope of the invention described in this application.

EXAMPLE 1

Si(100) wafers, boron doped to 30Ω-cm, were obtained from Virginia Semiconductor. They were RCA cleaned and introduced into a standard electron beam evaporator, having a background pressure of $1 \times 10^{-7}$ Torr. Amorphous $Si_{0.86}Ge_{0.14}$ layers 1000 angstroms thick were deposited directly onto Si(100) substrates at room temperature at a rate of 2 angstroms per second. No special precautions were taken to ensure a clean Si/amorphous SiGe interface. Following the deposition, the samples were cut into 2 cm by 2 cm pieces, dipped into hot trichloroethylene, acetone, and methanol, and etched in HF for 10s. Sample No. 1 was introduced into a tube furnace, which was flushed with nitrogen, and then brought to 900° C. The sample was oxidized at 900° C. in a steam ambient for 30 minutes. Samples No. 2 and No. 3 were oxidized in the same manner, but for a time of 60 and 120 minutes, respectively. The resultant oxide thicknesses, measured by ellipsometry, were 1490, 1840, and 3180 angstroms, for samples 1, 2 and 3. The oxide was then stripped in a buffered HF solution, and the samples were introduced into a high-vacuum system.

The samples were examined at 100kV using a Hitachi H-600 TEM. This revealed that in Sample No. 1, the layer was polycrystalline. In Sample No. 2, the layer was part polycrystalline and part single crystal. In sample No. 3, however, the layer was fully epitaxial with the substrate.

EXAMPLE 2

Si(100) wafers, boron doped to 30Ω-cm, were obtained from Virginia Semiconductor. They were RCA cleaned and introduced into a standard electron beam evaporator, having a background pressure of $1 \times 10^{-7}$ Torr. Amorphous $Si_{0.7}Ge_{0.3}$ layers 1000 angstroms thick were deposited directly onto Si(100) substrates at room temperature at a rate of 2 angstroms per second. No special precautions were taken to ensure a clean Si/amorphous SiGe interface. Following the deposition, the samples were cut into 2 cm by 2 cm pieces, dipped into hot trichloroethylene, acetone, and methanol, and etched in HF for 10s. Sample No. 1 was introduced into a tube furnace, which was flushed with nitrogen, and then brought to 900° C. The sample was oxidized at 900° C. in a steam ambient for 30 minutes. Samples No. 2 and No. 3 were oxidized in the same manner, but for a time of 60 and 100 minutes, respectively. The resultant oxide thicknesses, measured by ellipsometry, were 1928, 3520, and 3620 angstroms, for samples 1, 2 and 3, respectively. The oxide was then stripped in a buffered HF solution, and the samples were introduced into a high-vacuum system.

The samples were examined at 100kV using a Hitachi H-600 TEM. This revealed that in Sample No. 1, the layer was polycrystalline. In Sample No. 2, the layer was part polycrystalline and part single crystal. In sample No. 3, however, the layer was fully epitaxial with the substrate.

EXAMPLE 3

Si(100) wafers, boron doped to 30Ω-cm, were obtained from Virginia Semiconductor. They were RCA cleaned and introduced into a standard electron beam evaporator, having a background pressure of $1 \times 10^{-7}$ Torr. Amorphous $Si_{0.56}Ge_{0.44}$ layers 1000 angstroms thick were deposited directly onto Si(100) substrates at room temperature at a rate of 2 angstroms per second. No special precautions were taken to ensure a clean Si/amorphous SiGe interface. Following the deposition, the samples were cut into 2 cm by 2 cm pieces, dipped into hot trichloroethylene, acetone, and methanol, and etched in HF for 10s. Sample No. 1 was introduced into a tube furnace, which was flushed with nitrogen, and then brought to 900° C. The sample was oxidized at 900° C. in a steam ambient for 30 minutes. Samples No. 2 and No. 3 were oxidized in the same manner, but for a time of 60 and 80 minutes, respectively. The resultant oxide thicknesses, measured by ellipsometry, were 2836, 4035, and 5020 angstroms, for samples 1, 2 and 3, respectively. The oxide was then stripped in a buffered HF solution, and the samples were introduced into a high-vacuum system.

The samples were examined at 100kV using a Hitachi H-600 TEM. This revealed that in Sample No. 1, the layer was for the most part epitaxial, although some polycrystalline material remained. In Sample No. 2, the layer was almost fully epitaxial. In sample No. 3, however, the layer was fully epitaxial with the substrate.

Obviously, many modifications and variations of the present invention are possible in light of the above teachings. It is therefore to be understood that within the scope of the appended claims, the invention may be practiced otherwise than as specifically described.

What we claim is:

1. A method of forming epitaxial Si-Ge heterostructures comprising:
    depositing a layer of amorphous Si-Ge on a silicon wafer; and
    wet oxidizing said amorphous Si-Ge deposited on said silicon wafer at a temperature and time sufficient to form an epitaxial Si-Ge heterostructure.

2. A method as described in claim 1 wherein said silicon wafer is selected from the group comprising Si(100) at about 0° to about 6° to <010> wafers.

3. A method as described in claim 2 wherein said silicon wafer is an Si(100) wafer.

4. A method as described in claim 1 wherein said silicon wafer is doped prior to depositing said layer of amorphous Si-Ge on said silicon wafer.

5. A method as described in claim 4 wherein said dopant is selected from the group comprising boron, phosphorous and arsenic.

6. A method as described in claim 4 wherein said silicon wafer is doped at a range of between about $0.1\Omega$-cm to about $300\Omega$-cm resistivity.

7. A method as described in claim 1 wherein said silicon wafer has any contaminants removed from said silicon wafer.

8. A method as described in claim 7 wherein said contaminants are removed by means of an RCA cleaning method.

9. A method as described in claim 1 wherein said amorphous Si-Ge layer is deposited by means of vacuum evaporation or sputtering.

10. A method as described in claim 9 wherein the means is vacuum evaporation.

11. A method as described in claim 1 wherein the ratio of Si to Ge is $Si_xGe_{1-x}$ where x is less than 1 and greater than 0.

12. A method as described in claim 11 wherein x is between about 0.1 and about 0.9.

13. A method as described in claim 1 wherein the temperature is high enough to produce epitaxial Si-Ge but low enough so that the Ge does not evaporate.

14. A method as described in claim 13 wherein the temperature is between about 800° C. and about 1000°C.

15. A method as described in claim 14 wherein the temperature is about 900° C.

16. A method of forming epitaxial Si-Ge heterostructures comprising:
doping a silicon wafer to form a doped silicon wafer;
removing contaminants from said doped silicon wafer to form a cleaned doped silicon wafer;
depositing a layer of amorphous Si-Ge on said cleaned doped silicon wafer to form an amorphous Si-Ge/Si wafer;
removing contaminants from said Si-Ge/Si wafer;
wet oxidizing said amorphous Si-Ge/Si wafer at a temperature and time sufficient to form an epitaxial Si-Ge heterostructure.

* * * * *